(12) United States Patent
Fifield et al.

(10) Patent No.: US 8,902,679 B2
(45) Date of Patent: Dec. 2, 2014

(54) MEMORY ARRAY WITH ON AND OFF-STATE WORDLINE VOLTAGES HAVING DIFFERENT TEMPERATURE COEFFICIENTS

(75) Inventors: John A. Fifield, Underhill, VT (US); Mark D. Jacunski, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 13/534,096

(22) Filed: Jun. 27, 2012

(65) Prior Publication Data
US 2014/0003164 A1      Jan. 2, 2014

(51) Int. Cl.
| | | |
|---|---|---|
| G11C 5/14 | (2006.01) | |
| G11C 8/08 | (2006.01) | |
| H02J 1/10 | (2006.01) | |

(52) U.S. Cl.
USPC .................. 365/189.09; 365/230.06; 307/53

(58) Field of Classification Search
None
See application file for complete search history.

(56) References Cited

U.S. PATENT DOCUMENTS

| | | | |
|---|---|---|---|
| 5,666,046 A | 9/1997 | Mietus | |
| 5,703,476 A | 12/1997 | Merlo et al. | |
| 6,087,820 A | 7/2000 | Houghton et al. | |
| 6,181,191 B1 | 1/2001 | Paschal | |
| 6,531,911 B1 | 3/2003 | Hsu et al. | |
| 6,714,476 B2 | 3/2004 | Hsu et al. | |
| 7,057,958 B2 | 6/2006 | So et al. | |
| 7,307,468 B1* | 12/2007 | Vasudevan | 327/539 |
| 7,315,482 B2 | 1/2008 | Lin et al. | |
| 7,557,642 B2 | 7/2009 | Hsu et al. | |
| 7,570,107 B2 | 8/2009 | Kim et al. | |
| 7,583,535 B2 | 9/2009 | Sekar et al. | |
| 7,583,539 B2 | 9/2009 | Sekar et al. | |
| 7,957,215 B2 | 6/2011 | Tanzawa | |
| 2001/0002890 A1* | 6/2001 | Marr | 365/211 |
| 2002/0138688 A1* | 9/2002 | Hsu et al. | 711/105 |
| 2010/0074028 A1 | 3/2010 | Hirose et al. | |
| 2010/0195414 A1 | 8/2010 | Kim et al. | |
| 2011/0199837 A1 | 8/2011 | Reohr et al. | |

FOREIGN PATENT DOCUMENTS

WO    WO 2008/133674 A1    11/2008

OTHER PUBLICATIONS

Dai et al. "Threshold voltage based CMOS voltage reference", IEE Proc.—Circuits Devices Syst., vol. 151, No. 1, Feb. 2004.*

* cited by examiner

*Primary Examiner* — James G Norman
(74) *Attorney, Agent, or Firm* — Gibb & Riley, LLC; David A. Cain, Esq.

(57) ABSTRACT

Disclosed is a memory array structure, where a wordline driver selectively applies a high on-state voltage (VWLH) or a low off-state voltage (VWLL) to a wordline. VWLH has a slightly negative temperature coefficient so that it is regulated as high as the gate dielectric reliability limits allow, whereas VWLL has a substantially neutral temperature coefficient. To accomplish this, the wordline driver is coupled to one or more voltage regulation circuits. In one embodiment, the wordline driver is coupled to a single voltage regulation circuit, which incorporates a single voltage reference circuit having a single output stage that outputs multiple reference voltages. Also disclosed is a voltage reference circuit, which can be incorporated into the voltage regulation circuit of a memory array structure, as described, or, alternatively, into any other integrated circuit structure requiring voltages with different temperature coefficients. Also disclosed is a method of operating a memory array structure.

20 Claims, 9 Drawing Sheets

MEMORY ARRAY WITH ON AND OFF-STATE WORDLINE VOLTAGES HAVING DIFFERENT TEMPERATURE COEFFICIENTS

BACKGROUND

1. Field of the Invention

The embodiments disclosed herein relate to a memory array structure and an associated method of operating the memory array structure such that the on-state and off-state wordline voltages have different temperature coefficients for optimum performance. The embodiments disclosed herein also related to a voltage reference circuit that can be incorporated into a voltage regulation circuit for generating such a memory array structure.

2. Description of the Related Art

Oftentimes memory array structures such as, embedded dynamic random access memory (eDRAM) array structures, incorporate a bandgap voltage reference circuit to provide a single bandgap reference voltage (VBGR) for regulating multiple different voltage supplies. For example, the same VBGR may be used to regulate a relatively low off-state wordline voltage, which is also referred to herein as the wordline low voltage (VWLL); to regulate a relatively high wordline on-state voltage, which is also referred to herein as the wordline high voltage (VWLH); to clamp a sensing reference at a maximum voltage and to regulate a bitline voltage (VBL). Typically, bandgap voltage reference circuits are designed such that this single bandgap reference voltage (VBGR) has a substantially neutral (i.e., 0-value or flat) temperature coefficient (TC) so that the resulting supply voltages (e.g., VWLL, VWLH, VBL, etc.) remain constant despite any changes in temperature. However, as technology scales to 32 nm and smaller, it may be advantageous to regulate one or more of these supply voltages as a function of temperature.

SUMMARY

In view of the foregoing, disclosed herein are embodiments of a memory array structure (e.g., embedded dynamic random access memory (eDRAM) array structures), where a wordline driver is coupled to a wordline and selectively applies either a relatively high on-state voltage (VWLH) to the wordline or a relatively low off-state voltage (VWLL) to the wordline. However, in this case, the on-state voltage (VWLH) and the off-state voltage (VWLL) have different temperature coefficients. Specifically, the on-state voltage (VWLH) has a slightly negative temperature coefficient so that it is regulated as high as the gate dielectric reliability limits allow, whereas the off-state voltage (VWLL) has a substantially neutral temperature coefficient. To accomplish this, the wordline driver can be electrically coupled to one or more voltage regulations circuits. For example, in one embodiment, the wordline driver can be electrically coupled to a single voltage regulation circuit, which incorporates a single voltage reference circuit having a single output stage that outputs multiple reference voltages with different temperature coefficients. These reference voltages are then used to generate the on-state voltage (VWLH) and off-state voltage (VWLL) for the wordline. Also disclosed herein are embodiments of such a voltage reference circuit, which can be incorporated into the voltage regulation circuit of a memory array structure, as described, or, alternatively, incorporated into any other integrated circuit structure requiring voltages with the different temperature coefficients. Finally, also disclosed herein are embodiments of a method of operating a memory array structure.

More particularly, disclosed herein are embodiments of a memory array structure. The memory array structure can comprise a plurality of memory cells and a wordline operatively connected to the memory cells. A wordline driver can be coupled to the wordline and can selectively apply either a relatively high on-state voltage (VWLH) to the wordline or a relatively low off-state voltage (VWLL) to the wordline. However, rather than both the on-state voltage (VWLH) and off-state voltage (VWLL) each having a substantially neutral temperature coefficient, the on-state voltage (VWLH) and off-state voltage (VWLL) can have different temperature coefficients. More specifically, the off-state voltage (VWLL) can have a substantially neutral temperature coefficient so that it remains essentially constant with changes in operating temperature; however, the on-state voltage (VWLH) can have a slightly negative temperature coefficient so that it increases slightly with decreasing operating temperature and vice versa. This slightly negative temperature coefficient of the on-state voltage (VWLH) can be pre-established in order to take advantage of increases in gate dielectric reliability at lower operating temperatures by increasing operating voltage and to compensate for decreases in gate dielectric reliability at higher temperatures by decreasing operating voltage.

Depending upon the embodiment of the memory array structure, the wordline driver can be electrically coupled to one or more voltage regulations circuits that provide the on-state voltage (VWLH) with the negative temperature coefficient and the off-state voltage (VWLL) with the substantially neutral temperature coefficient. For example, in one embodiment, the wordline driver can also be electrically coupled to a single voltage regulation circuit for providing the on-state voltage (VWLH) with a negative temperature coefficient and the off-state voltage (VWLL) with a substantially neutral temperature coefficient. In this embodiment, the single voltage regulation circuit can incorporate a single voltage reference circuit (e.g., a bandgap voltage reference circuit), which has a single output stage that is configured to output multiple reference voltages having different temperature coefficients.

Specifically, in this embodiment, the memory array structure can comprise a voltage regulation circuit, a plurality of memory cells, a wordline operatively connected to the memory cells and a wordline driver. This voltage regulation circuit can comprise a voltage reference circuit (e.g., a bandgap voltage reference circuit) having an output stage that outputs a first reference voltage with a negative temperature coefficient as well as a second reference voltage with a substantially neutral temperature coefficient. The voltage regulation circuit can further comprise a first voltage regulator, a positive voltage pump electrically connected in a first feedback loop to the first regulator, a second voltage regulator and a negative voltage pump electrically connected in a second feedback loop to the second voltage regulator. The first voltage regulator can receive the first reference voltage and the positive voltage pump can increase that first reference voltage by some factor in order to output a relatively high on-state voltage (VWLH) also with a negative temperature coefficient. The second voltage regulator can receive the second reference voltage and the negative voltage pump can decrease that second reference voltage by some (negative) factor in order to output a relatively low off-state voltage (VWLL) also with a substantially neutral temperature coefficient. The wordline driver can be coupled between the voltage regulation circuit and the wordline such that it can receive and selectively apply the on-state voltage (VWLH) with the negative temperature coefficient and the off-state voltage (VWLL) with the substantially neutral temperature coefficient to the wordline.

Also disclosed herein are embodiments of a specific voltage reference circuit (e.g., a bandgap voltage reference circuit), which can be incorporated into the memory array structure described above since it has a single output stage that is configured to output two or more reference voltages having different temperature coefficients. Specifically, the voltage reference circuit can comprise a pair of minor current sources and, particularly, a first current source outputting a first current having a negative temperature coefficient and a second current source outputting a second current having a positive temperature coefficient. The voltage reference circuit can further comprise a resistive network and a plurality of taps. The resistive network can electrically connect the first current source, the second current source and ground to a single node. The plurality of taps can be electrically connected to the resistive network at different locations and, due to mixing of the first current and the second current within the resistive network, the reference voltages at the different taps will have different temperature coefficients. Such a voltage reference circuit can, as mentioned above, be incorporated into a voltage regulation circuit of a memory array structure. Alternatively, such a voltage reference circuit can be incorporated into any other integrated circuit structure requiring two or more reference voltages having different temperature coefficients.

Also disclosed herein are embodiments of an associated method of operating a memory array structure such as that described above comprising a wordline operatively connected to a plurality of memory cells. The method embodiments can comprise receiving, by a wordline driver, a relatively high on-state voltage (VWLH) and a relatively low off-state voltage (VWLL), where the on-state voltage (VWLH) and off-state voltage (VWLL) have different temperature coefficients. The method can further comprise selectively applying, by the wordline driver to the wordline, either the on-state voltage (VWLH) or the off-state voltage (VWLL). As discussed in greater detail with regard to the structure embodiments above, the off-state voltage (VWLL) can have a substantially neutral temperature coefficient so that it remains essentially constant with changes in temperature. However, the on-state voltage (VWLH) can have a slightly negative temperature coefficient and this slightly negative temperature coefficient of the on-state voltage (VWLH) can be pre-established in order to take advantage of increases in gate dielectric reliability at lower operating temperatures by increasing operating voltage and to compensate for decreases in gate dielectric reliability at higher temperatures by decreasing operating voltage.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
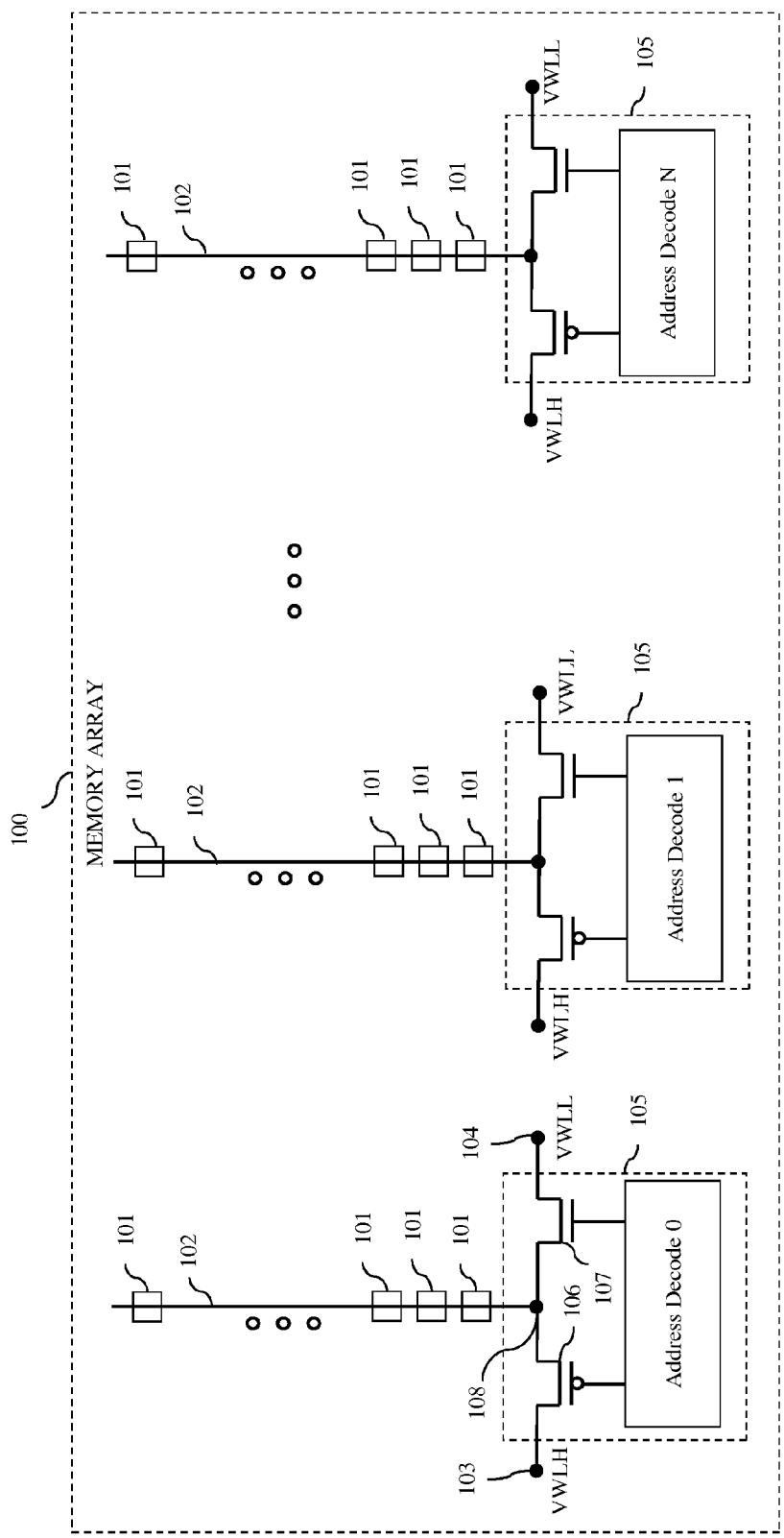
FIG. 1 is a schematic drawing illustrating an embodiment of a memory array structure.

As mentioned above, oftentimes memory array structures such as, embedded dynamic random access memory (eDRAM) array structures, incorporate a bandgap reference circuit to provide a single bandgap voltage reference voltage (VBGR) for regulating multiple different voltage supplies. For example, the same VBGR may be used to regulate a relatively low off-state wordline voltage, which is also referred to herein as the wordline low voltage (VWLL); to regulate a relatively high wordline on-state voltage, which is also referred to herein as the wordline high voltage (VWLH); to clamp a sensing reference at a maximum voltage and to regulate a bitline voltage (VBL). Typically, bandgap voltage reference circuits are designed such that this single bandgap reference voltage (VBGR) has a substantially neutral (i.e., 0-value or flat) temperature coefficient so that the resulting supply voltages (e.g., off-state voltage (VWLL), VWLH, VBL, etc.) remain constant despite any changes in temperature. However, as technology scales to 32 nm and smaller, it may be advantageous to regulate one or more of these supply voltages as a function of temperature. For example, it may be advantageous to ensure that the off-state voltage (VWLL) has a substantially neutral temperature coefficient in order to minimize sub-threshold voltage leakage and gate induced drain leakage (GIDL) with changes in temperature. However, since gate dielectric layer reliability decreases with increasing operating temperatures, it would be advantageous to provide an on-state voltage (VWLH) that has a slightly negative temperature coefficient so that the on-state voltage (VWLH) is regulated as high as the gate dielectric reliability limits allow. More specifically, since the threshold voltage of the wordline access transistor decreases with increasing operating temperature and since gate dielectric reliability increases with decreasing operating temperature, it would be advantageous to regulate the on-state voltage (VWLH) to a level that increases with decreasing operating temperature and vice versa.

In view of the foregoing, disclosed herein are embodiments of a memory array structure (e.g., embedded dynamic random access memory (eDRAM) array structures), where a wordline driver is coupled to a wordline and selectively applies either a relatively high on-state voltage (VWLH) to the wordline or a relatively low off-state voltage (VWLL) to the wordline. However, in this case, the on-state voltage (VWLH) and the off-state voltage (VWLL) have different temperature coefficients. Specifically, the on-state voltage (VWLH) has a slightly negative temperature coefficient so that it is regulated as high as the gate dielectric reliability limits allow, whereas the off-state voltage (VWLL) has a substantially neutral temperature coefficient. To accomplish this, the wordline driver can be electrically coupled to one or more voltage regulation circuits. For example, in one embodiment, the wordline driver can be electrically coupled to a single voltage regulation circuit, which incorporates a single voltage reference circuit having a single output stage that outputs multiple reference voltages with different temperature coefficients. These reference voltages are then used to regulate the on-state voltage (VWLH) and off-state voltage (VWLL) for the wordline. Also disclosed herein are embodiments of such a voltage reference circuit, which can be incorporated into the voltage regulation circuit of a memory array structure, as described, or, alternatively, incorporated into any other integrated circuit structure requiring voltages with the different temperature coefficients. Finally, also disclosed herein are embodiments of a method of operating a memory array structure.

More particularly, referring to FIG. 1, disclosed herein are embodiments of a memory array structure 100. This memory array structure 100 can comprise a plurality of memory cells 101 and a plurality of wordlines 102 and a plurality of bitlines (not shown) operatively coupled to the memory cells 101 for selectively accessing the memory cells.

In one embodiment, the memory cells 101 can comprise dynamic random access memory (DRAM) cells such that the memory array structure 100 comprises a dynamic random access memory (DRAM) array or an embedded dynamic access memory (eDRAM) array. Such DRAM cells are well known in the art and, thus, the details of their structure and operation are omitted from this specification in order to allow the reader to focus on the salient aspects of the disclosed embodiments. In other embodiment, the memory cells can comprise static random access memory (SRAM) cells such that the memory array structure 100 comprises a static random access memory (SRAM) array structure. Such SRAM cells are well known in the art and, thus, the details of their structure and operation are omitted from this specification in order to allow the reader to focus on the salient aspects of the disclosed embodiments. Alternatively, the memory cells can comprise any other type of memory cells accessed through a combination of wordlines and bitlines.

In any case, each of the wordlines 102 can further be coupled to a corresponding wordline driver 105. The wordline driver 105 can selectively connect (i.e., can be adapted to selectively connect, can be configured to selectively connect, etc.) its wordline 102 to either a first node 103 in order to apply a relatively high on-state voltage (VWLH) to the wordline 102 or second node 104 in order to apply a relatively low off-state voltage (VWLL) to the wordline 102. For example, each wordline driver 105 can comprise a P-type field effect transistor (PFET) 106 (i.e., a pull-up transistor) and an N-type field effect transistor (NFET) 107 (i.e., a pull-down transistor) electrically connected in series between the first node 103 and second node 104, as shown. The wordline 102 can be coupled to a junction node 108 at the junction between the two transistors 106 and 107. The wordline driver 105 can further comprise an address decoder that selectively biases the gates for the two transistors 106 and 107 in order to apply either the relatively high on-state voltage (VWLH) from the first node 103 or the relatively low off-state voltage (VWLL) from the second node 104 to the wordline 102 at the junction node 108.

Figure 2:
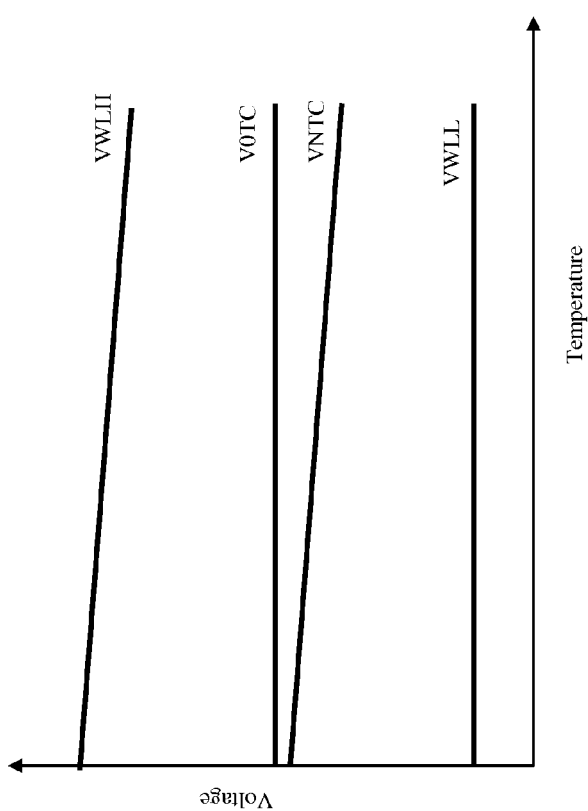
FIG. 2 is a graph illustrating changes in exemplary reference voltages as a function of changes in temperature.

Furthermore, the on-state voltage (VWLH) at the first node 103 and the off-state voltage (VWLL) at the second node 104 can have different temperature coefficients, rather than both having a substantially neutral temperature coefficient as typically seen in prior art memory array structures. More specifically, as shown in the graph of FIG. 2, the relatively low off-state voltage (VWLL) at the second node 104 can have a substantially neutral temperature coefficient (also referred to herein as a flat temperature coefficient or a 0-value temperature coefficient). For purposes of this disclosure, it should be understood that a voltage with a "substantially neutral temperature coefficient" means that the voltage remains essentially constant with changes in operating temperature. That is, the voltage will change, if at all, only +/−1 mV with changes in operating temperature of less than 150° C. The relatively high on-state voltage (VWLH) at the first node 103 can have a slightly negative temperature coefficient so that it increases slightly with decreasing operating temperature and vice versa. This slightly negative temperature coefficient of the on-state voltage (VWLH) can be pre-established in order to take advantage of increases in gate dielectric reliability at lower operating temperatures by increasing the maximum operating voltage and to compensate for decreases in gate dielectric reliability at higher temperatures by decreasing the maximum operating voltage. For example, in one embodiment, the relatively low off-state voltage (VWLL) can be approximately −0.354V and can remain essentially constant at all temperatures between −25° C. and 125° C. However, the relatively high on-state voltage (VWLH) can decrease from approximately 1.670V to approximately 1.600V when the operating temperature increases from approximately −25° C. to approximately 125° C. and vice versa.

Depending upon the embodiment of the memory array structure 100, the wordline driver 105 can be electrically connected to one or more voltage regulation circuits for providing the relatively high on-state voltage (VWLH) with a negative temperature coefficient to the first node 103 and the relatively low off-state voltage (VWLL) with a substantially neutral temperature coefficient to second node 104.

Figure 3:
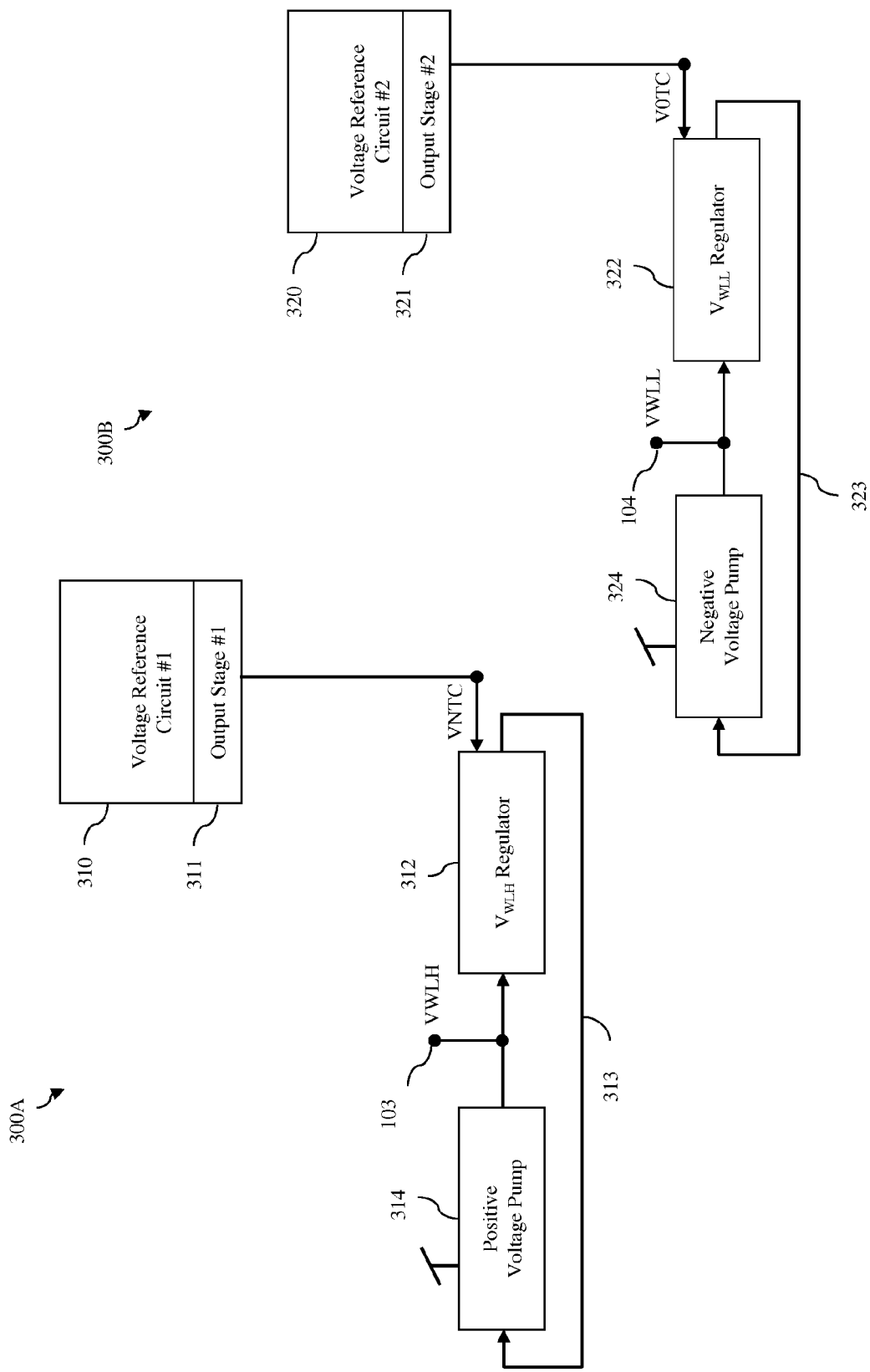
FIG. 3 is a schematic diagram illustrating exemplary voltage regulation circuits for providing the relatively high on-state voltage (VWLH) with a negative temperature coefficient and the relatively low off-state voltage (VWLL) with a substantially neutral temperature coefficient to each wordline driver in the memory array structure of FIG. 1.

For example, referring to FIG. 3 in combination with FIG. 1, in one embodiment of the memory array structure the nodes 103 and 104 of each wordline driver 105 can be electrically coupled to different voltage regulation circuits 300A and 300B that provide the relatively high on-state voltage (VWLH) with a negative temperature coefficient and the relatively low off-state voltage (VWLL) with a substantially neutral temperature coefficient, respectively. Each of these voltage regulation circuits 300A and 300B can incorporate a corresponding voltage reference circuit 310 and 320. Each voltage reference circuit 310, 320 has a single output stage 311, 321 that outputs a single reference voltage (e.g., see U.S. Pat. No. 6,087,820 of Houghton et al. issued on Jul. 11, 2000 and incorporated herein by reference, where multiple bandgap voltage reference circuits are used to supply multiple reference voltages). The reference voltages from the output stages 311, 321 of the voltage reference circuits 310, 320 in the different voltage regulation circuits 300A, 300B can be different.

Specifically, in this embodiment, the first voltage regulation circuit 300A can comprise a first voltage reference circuit 310 having an output stage 311 that can output (i.e., can be adapted to output, can be configured to output, etc.) a first reference voltage with a slightly negative temperature coefficient (VNTC). For example, with the slightly negative temperature coefficient, this first reference voltage (VNTC) can decrease from approximately 0.477V at −25° C. to approximately 0.457V at 125° C. and vice versa. This first reference voltage (VNTC) can be applied to a first voltage regulator 312, which is connected in a first feedback loop 313 to a positive voltage pump 314, so as to output a relatively high on-state voltage (VWLH) that is, for example, 3.5 times the first reference voltage (VNTC) (e.g., for selective application in a memory array structure by a wordline driver to a wordline). Since the first reference voltage (VNTC) varies slightly with temperature, so will the relatively high on-state voltage (VWLH) (i.e., it too will have a slightly negative temperature coefficient). So, for example, if the first reference voltage (VNTC) decreases from approximately 0.477V at −25° C. to approximately 0.457V at 125° C., the resulting on-state voltage (VWLH), which is 3.5 times the first reference voltage (VNT), will decrease from 1.670V at −25° C. to approximately 1.600V at 125° C. and vice versa.

The second voltage regulation circuit 300B can comprise a second voltage reference circuit 320 with an output stage 321 that can output (i.e., can be adapted to output, can be configured to output, etc.) a second reference voltage with a substantially neutral (i.e., flat or 0-value) temperature coefficient (V0TC). For example, this second reference voltage (V0TC) can be approximately 0.502V at all temperatures ranging from −25° C. to 125° C. This second reference voltage (V0TC) can be applied to a second voltage regulator 322, which is connected in a second feedback loop 323 to a negative voltage pump 324, so as to output a relatively low off-state voltage (VWLL) that is, for example, −0.7 times the second reference voltage (V0TC) (e.g., for selective application in a memory array structure by a wordline driver to a wordline). Since the second reference voltage (V0TC) remains constant with temperature changes, so will the relatively low off-state voltage (VWLL) (i.e., it too will have a substantially neutral temperature coefficient). So, for example, if the second reference voltage (V0TC) is approximately 0.502V at all temperatures ranging from −25° C. to 125° C., the relatively low off-state voltage (VWLL), which is −0.7 times the second reference voltage (V0TC), will be approximately −0.354V at all temperatures ranging from −25° C. to 125° C.

Figure 4:
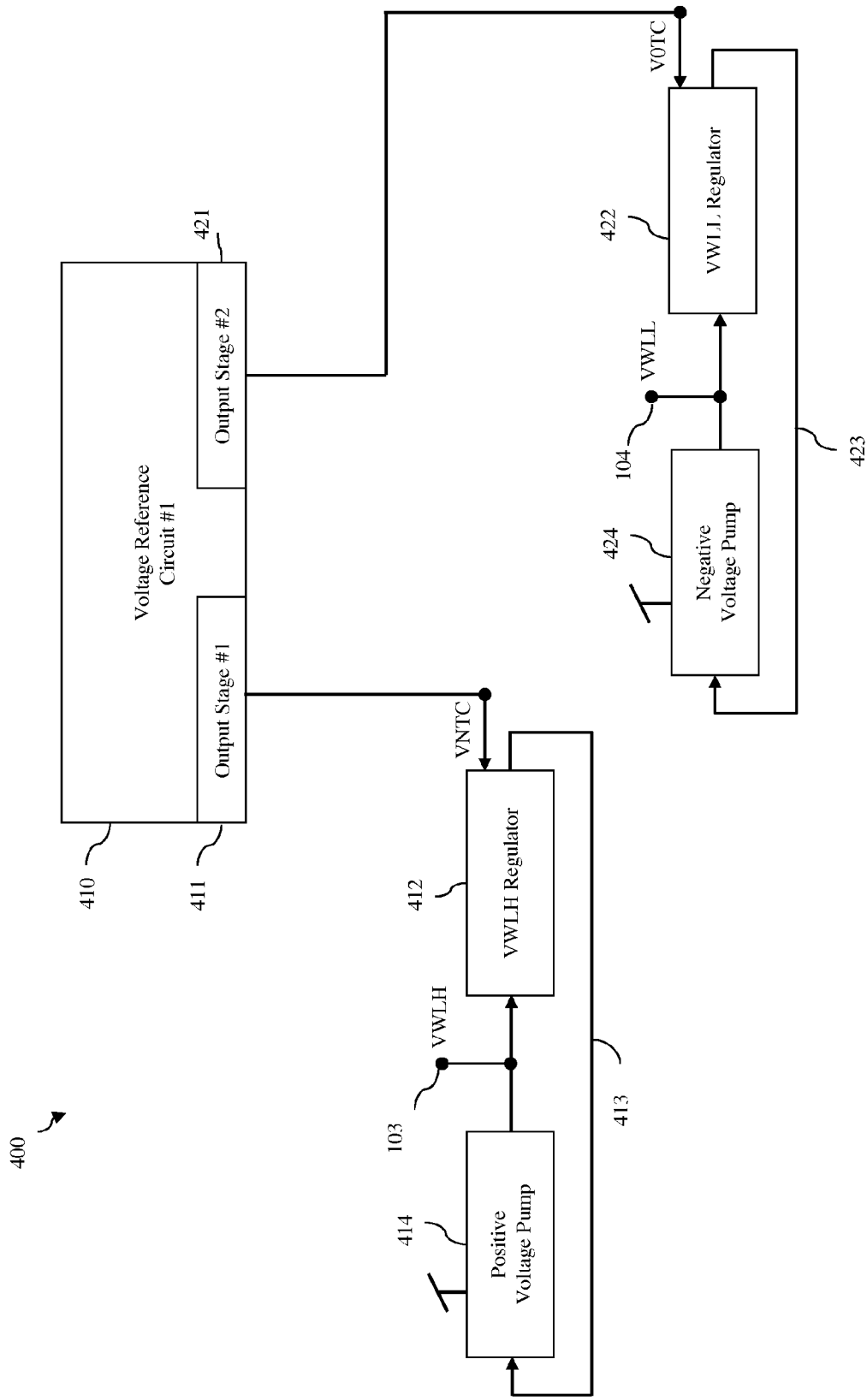
FIG. 4 is a schematic diagram illustrating an exemplary voltage regulation circuit for providing the relatively high on-state voltage (VWLH) with a negative temperature coefficient and the relatively low off-state voltage (VWLL) with a substantially neutral temperature coefficient to each wordline driver in the memory array structure of FIG. 1.

Alternatively, referring to FIG. 4 in combination with FIG. 1, in another embodiment of the memory array structure the nodes 103 and 104 of each wordline driver 105 can be electrically coupled to a single voltage regulation circuit 400 for providing the relatively high on-state voltage (VWLH) with a negative temperature coefficient and the relatively low off-state voltage (VWLL) with a substantially neutral temperature coefficient, respectively. This voltage regulation circuit 400 can incorporate a voltage reference circuit 410 (e.g., a bandgap voltage reference circuit) having multiple discrete output stages 411, 421, where each output stage 411, 421 outputs a single reference voltage (e.g., see U.S. Pat. No. 7,307,468 of Vasudevan issued on Dec. 11, 2007 and incorporated herein by reference, where a bandgap voltage reference circuit has multiple output stages). The reference voltages from the output stages 411, 421 of the voltage reference circuit 410 in the voltage regulation circuit 400 can be different.

Specifically, in this embodiment, the voltage regulation circuit 400 can comprise a voltage reference circuit 410 having two output stages 411, 421. The first output stage 411 can output (i.e., can be adapted to output, can be configured to output, etc.) a first reference voltage with a slightly negative temperature coefficient (VNTC). For example, with the slightly negative temperature coefficient, this first reference voltage (VNTC) can decrease from approximately 0.477V at −25° C. to approximately 0.457V at 125° C. and vice versa. This first reference voltage (VNTC) can be applied to a first voltage regulator 412, which is connected in a first feedback loop 413 to a positive voltage pump 414, so as to output a relatively high on-state voltage (VWLH) that is, for example, 3.5 times the first reference voltage (VNTC) (e.g., for selective application in a memory array structure by a wordline driver to a wordline). Since the first reference voltage (VNTC) varies slightly with temperature, so will the relatively high on-state voltage (VWLH) (i.e., it too will have a slightly negative temperature coefficient). So, for example, if the first reference voltage (VNTC) decreases from approximately 0.477V at −25° C. to approximately 0.457V at 125° C., the resulting on-state voltage (VWLH), which is 3.5 times the first reference voltage (VNT), will decrease from 1.670V at −25° C. to approximately 1.600V at 125° C. and vice versa.

The second output stage 421 can output (i.e., can be adapted to output, can be configured to output, etc.) a second reference voltage with a substantially neutral (i.e., flat or 0-value) temperature coefficient (V0TC). For example, this second reference voltage (V0TC) can be approximately 0.502V at all temperatures ranging from −25° C. to 125° C. This second reference voltage (V0TC) can be applied to a second voltage regulator 422, which is connected in a second feedback loop 423 to a negative voltage pump 424, so as to output a relatively low off-state voltage (VWLL) that is, for example, −0.7 times the second reference voltage (V0TC) (e.g., for selective application in a memory array structure by a wordline driver to a wordline). Since the second reference voltage (V0TC) remains constant with temperature changes, so will the relatively low off-state voltage (VWLL) (i.e., it too will have a substantially neutral temperature coefficient). So, for example, if the second reference voltage (V0TC) is approximately 0.502V at all temperatures ranging from −25° C. to 125° C., the relatively low off-state voltage (VWLL), which is −0.7 times the second reference voltage (V0TC), will be approximately −0.354V at all temperatures ranging from −25° C. to 125° C.

Figure 5:
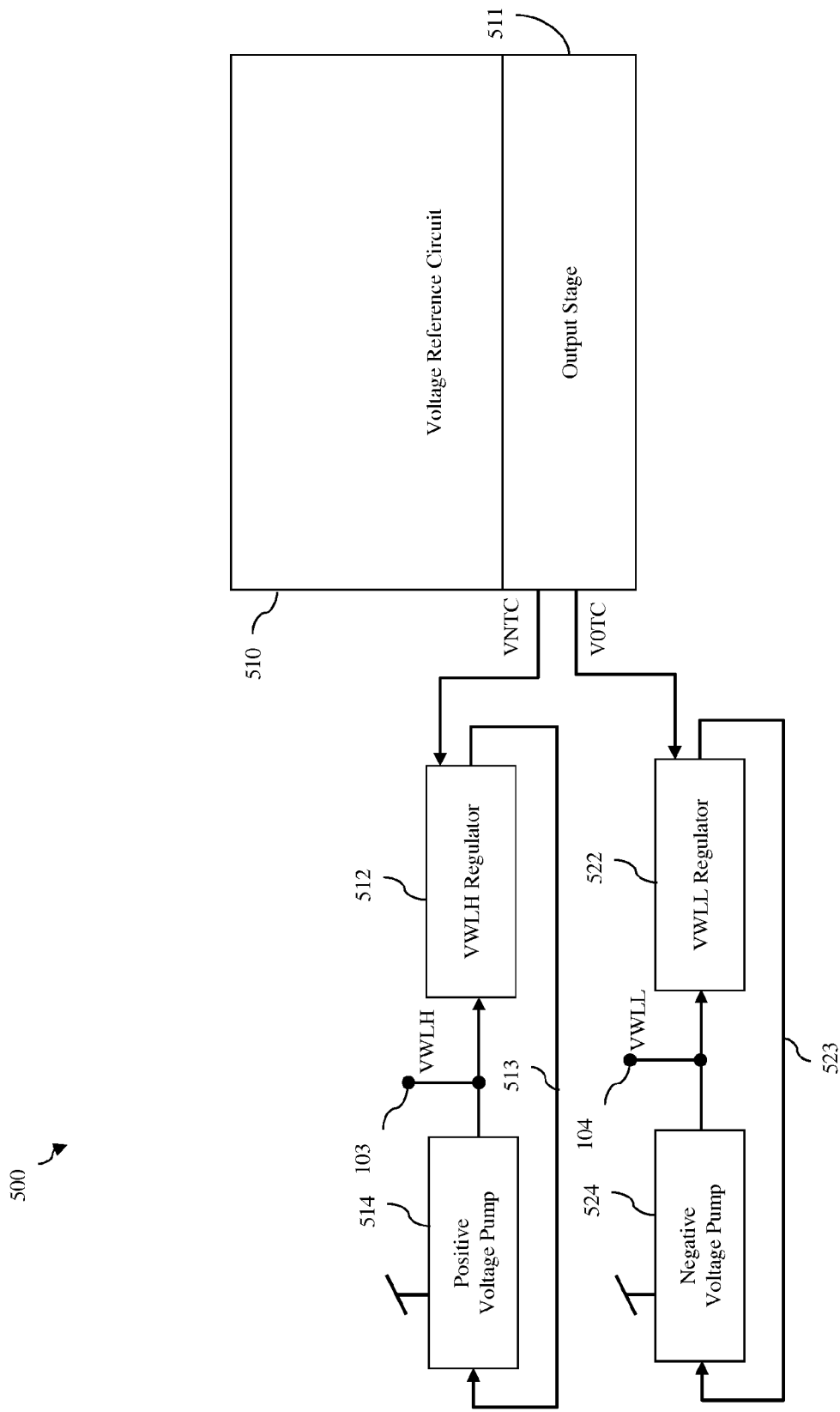
FIG. 5 is a schematic diagram illustrating another exemplary voltage regulation circuit for providing the relatively high on-state voltage (VWLH) with a negative temperature coefficient and the relatively low off-state voltage (VWLL) with a substantially neutral temperature coefficient to each wordline driver in the memory array structure of FIG. 1.

Referring to FIG. 5 in combination with FIG. 1, in yet another embodiment of the memory array structure the nodes 103 and 104 of each wordline driver 105 can also be electrically coupled to a single voltage regulation circuit 500 for providing the relatively high on-state voltage (VWLH) with a negative temperature coefficient and the relatively low off-state voltage (VWLL) with a substantially neutral temperature coefficient, respectively. However, in this embodiment, the single voltage regulation circuit 500 can incorporate a single voltage reference circuit 510 (e.g., a bandgap voltage reference circuit), which has a single output stage 511 that outputs (i.e., is adapted to output, configured to output, etc.) multiple reference voltages having different temperature coefficients.

Specifically, the single output stage 511 can output (i.e., can be adapted to output, can be configured to output, etc.) a first reference voltage with a slightly negative temperature coefficient (VNTC) and a second reference voltage with a substantially neutral (i.e., flat or 0-value) temperature coefficient (V0TC). For example, with the slightly negative temperature coefficient, this first reference voltage (VNTC) can decrease from approximately 0.477V at −25° C. to approximately 0.457V at 125° C. and vice versa. This first reference voltage (VNTC) can be applied to a first voltage regulator 512, which is connected in a first feedback loop 513 to a positive voltage pump 514, so as to output a relatively high on-state voltage (VWLH) that is, for example, 3.5 times the first reference voltage (VNTC) (e.g., for selective application in a memory array structure by a wordline driver to a wordline). Since the first reference voltage (VNTC) varies slightly with temperature, so will the relatively high on-state voltage (VWLH) (i.e., it too will have a slightly negative temperature coefficient). So, for example, if the first reference voltage (VNTC) decreases from approximately 0.477V at −25° C. to approximately 0.457V at 125° C., the resulting on-state voltage (VWLH), which is 3.5 times the first reference voltage (VNT), will decrease from 1.670V at −25° C. to approximately 1.600V at 125° C. and vice versa.

The single output stage 511 can also output (i.e., can also be adapted to output, can also be configured to output, etc.) a second reference voltage with a substantially neutral (i.e., flat or 0-value) temperature coefficient (V0TC). For example, this second reference voltage (V0TC) can be approximately 0.502V at all temperatures ranging from −25° C. to 125° C. This second reference voltage (V0TC) can be applied to a second voltage regulator 522, which is connected in a second feedback loop 523 to a negative voltage pump 524, so as to output a relatively low off-state voltage (VWLL) that is, for example, −0.7 times the second reference voltage (V0TC) (e.g., for selective application in a memory array structure by a wordline driver to a wordline). Since the second reference voltage (V0TC) remains constant with temperature changes, so will the relatively low off-state voltage (VWLL) (i.e., it too will have a substantially neutral temperature coefficient). So, for example, if the second reference voltage (V0TC) is approximately 0.502V at all temperatures ranging from −25° C. to 125° C., the relatively low off-state voltage (VWLL), which is −0.7 times the second reference voltage (V0TC), will be approximately −0.354V at all temperatures ranging from −25° C. to 125° C.

Consequently, as shown in the graph of FIG. 2, in each of the memory array structure embodiments discussed above, the second reference voltage (V0TC) and off-state voltage (VWLL) will have a substantially neutral temperature coefficient (also referred to herein as a flat temperature coefficient or a 0-value temperature coefficient) so that they remain essentially constant with changes in temperature; however, the first reference voltage (VNTC) and the on-state voltage (VWLH) will have the same slightly negative temperature coefficient so that they increase slightly with decreasing operating temperature.

Figure 6:
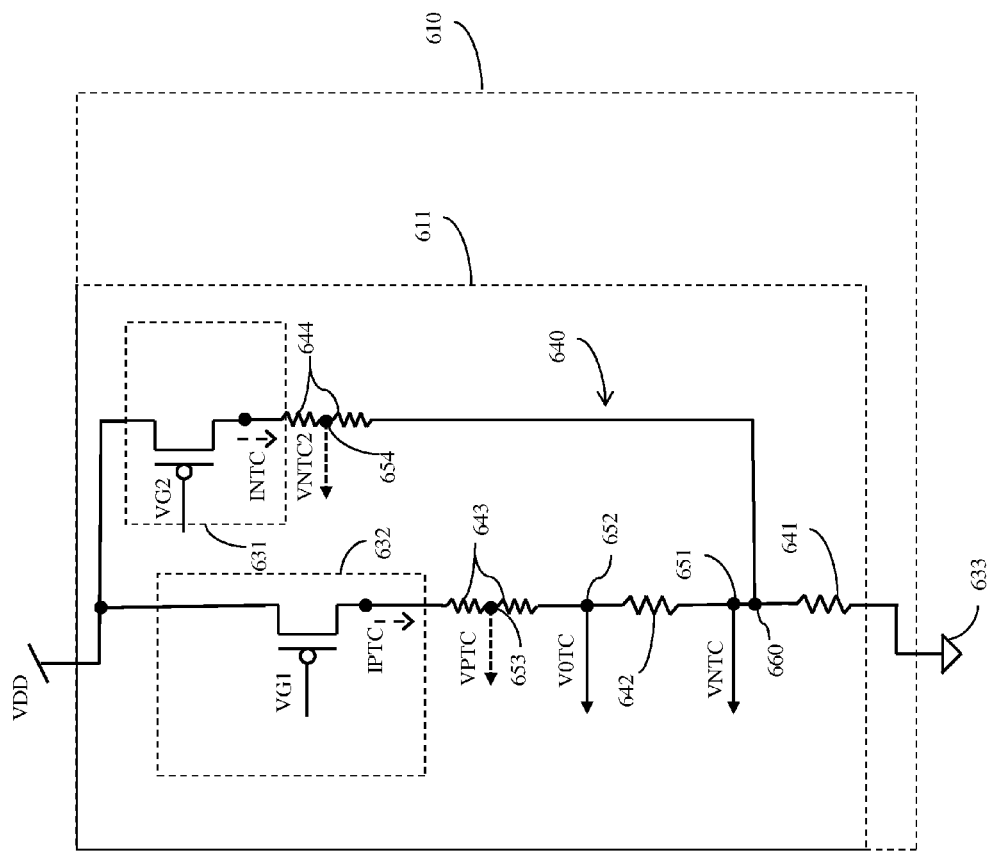
FIG. 6 is a schematic diagram illustrating an exemplary voltage reference circuit with an output stage having different taps at different locations for supplying reference voltages with different temperature coefficients.

Referring to FIG. 6, also disclosed herein are embodiments of a specific voltage reference circuit 610 that has a single output stage 611 that outputs (i.e., is adapted to output, configured to output, etc.) two or more reference voltages (e.g., see V0TC and VNTC) having different temperature coefficients. Such a voltage reference circuit 610 can be incorporated into a voltage regulation circuit of a memory array structure, such as that described above and illustrated in FIG. 5, or, alternatively, can be incorporated into any other integrated circuit structure requiring two or more reference voltages having different temperature coefficients. Specifically, this voltage reference circuit 610 can comprise an output stage 611 comprising a pair of minor current sources 631 and 632, a resistive network 640 and a plurality of taps (e.g., at least taps 651 and 652).

The current sources can comprise a first current source 631 and a second current source 632. The first current source 631 can output (i.e., can be adapted to, can be configured, etc.) a first current having a negative temperature coefficient (INTC) and the second current source 632 can output a second current having a positive temperature coefficient (IPTC).

The resistive network 640 can electrically connect the first current source 631, the second current source 632 and ground 633 at a single node 660. The resistive network 640 can comprise a first resistor 641, a second resistor 642 and a third resistor 643 connected in series between ground 633 and the second current source 632 as well as a fourth resistor 644 connected in series between the node 660 and first current source 631. As a result, the first resistor 641 effectively functions as a shunt resistor, thereby forming a voltage divider, and the resistive network 640 effectively functions as a mixing circuit with a DC path to ground 633, thereby allowing the first current (INTC) from the first current source 631 and the second current (IPTC) from the second current source 632 to mix.

Taps can be electrically connected to the resistive network 640 at different locations and, due to the mixing of the first current (INTC) and second current (IPTC) within the resistive network 640, the reference voltages at the different taps at the different locations will have different temperature coefficients. When such a voltage reference circuit 610 is incorporated into the voltage regulation circuit of a memory array structure, such as shown in FIG. 5, the plurality of taps can comprise a first tap 651 and a second tap 652. The first tap 651 can be electrically connected to the resistive network 640 between the first resistor 641 and the second resistor 642 (e.g., at or near the node 660) such that, due to mixing of the first and second currents (i.e., INTC and IPTC) at that location, the first reference voltage (VNTC) on the first tap 651 has a slightly negative temperature coefficient. The second tap 652 can be electrically connected to the resistive network 640 between the second resistor 642 and the second current source 632 (e.g., between the second resistor 642 and the third resistor 643) such that, due to mixing of the first and second currents (i.e., INTC and IPTC) at that location, the second reference voltage (V0TC) on the second tap 652 has a substantially neutral temperature coefficient (i.e., a flat or 0-value temperature coefficient). When such a voltage reference circuit 610 is incorporated into any other integrated circuit structure that requires two or more reference voltages having different temperature coefficients, the taps can be positioned at these locations or anywhere elsewhere along the resistive network in order to achieve the desired temperature coefficients.

For example, the plurality of taps can, additionally or alternatively, comprise a third tap 653 electrically connected to the resistive network 640 in a location within the third resistor 643 to output a reference voltage VPTC with a more positive temperature coefficient than that of second voltage reference V0TC. In one example, third resistor 643 can be split into two smaller resistors and the center tap disposed between is connected to node VPTC. In this example the output node VPTC will be closer to the second current source 632 (IPTC) and more resistively isolated from first current source 631 (INTC) and will therefore have a more positive temperature coefficient that of second voltage reference V0TC.

Additionally or alternatively, the plurality of taps can comprise a fourth tap 654 electrically connected to the resistive network 640 in a location within the fourth resistor 644 to output a reference voltage VNTC2 which has a more negative temperature coefficient than that of the first reference voltage (VNTC). In an example, fourth resistor 644 can be split into two resistors and the center tap disposed between is connected to node VNTC2. In this example the output node VNTC2 will be closer to the first current source 631 (INTC) and more resistively isolated from the second current source 632 (IPTC) and will therefore have a more negative temperature coefficient than that of first voltage reference VNTC.

Figure 7:
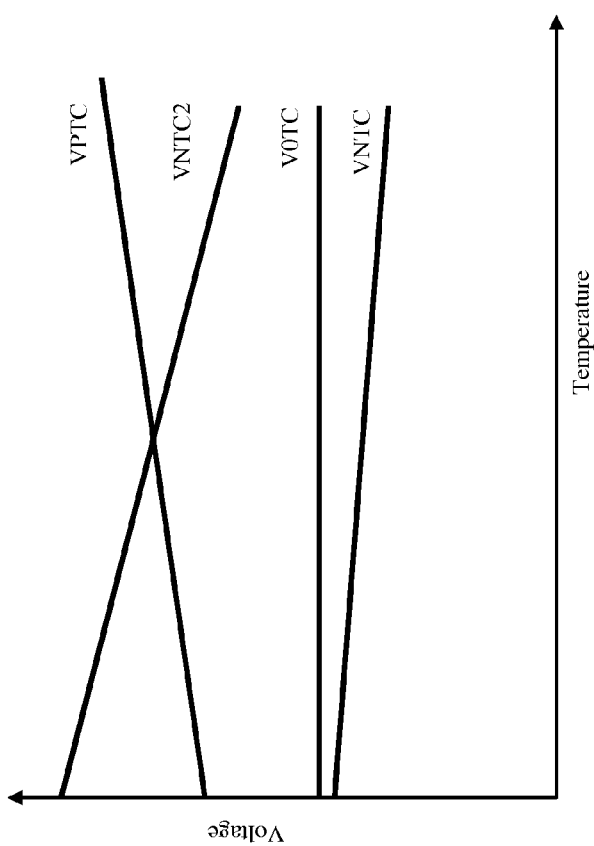
FIG. 7 is another graph illustrating changes in exemplary reference voltages as a function of changes in temperature.

Thus, referring to the graph of FIG. 7 in combination with FIG. 6, an exemplary voltage reference circuit with different taps (e.g., 651-654) at different locations can supply any of the following reference voltages: (a) a first reference voltage (VNTC) at the first tap 651 with a relatively small negative temperature coefficient so that it decreases slightly as the operating temperature increases; (b) a second reference voltage (V0TC) at the second tap 652 with a substantially neutral temperature coefficient so that it remains essentially constant as the operating temperature increases; (c) a third reference voltage (VPTC) at the third tap 652 with a positive temperature coefficient so that it increases as the operating temperature increases; (d) a fourth reference voltage (VNTC2) at the fourth tap 654 with a relatively large negative temperature coefficient so that it decreases significantly as the operating temperature increases; and/or (e) any other reference voltage at any other location on the resistive network 740 preselected to achieve a reference voltage with a desired temperature coefficient.

Figure 8:
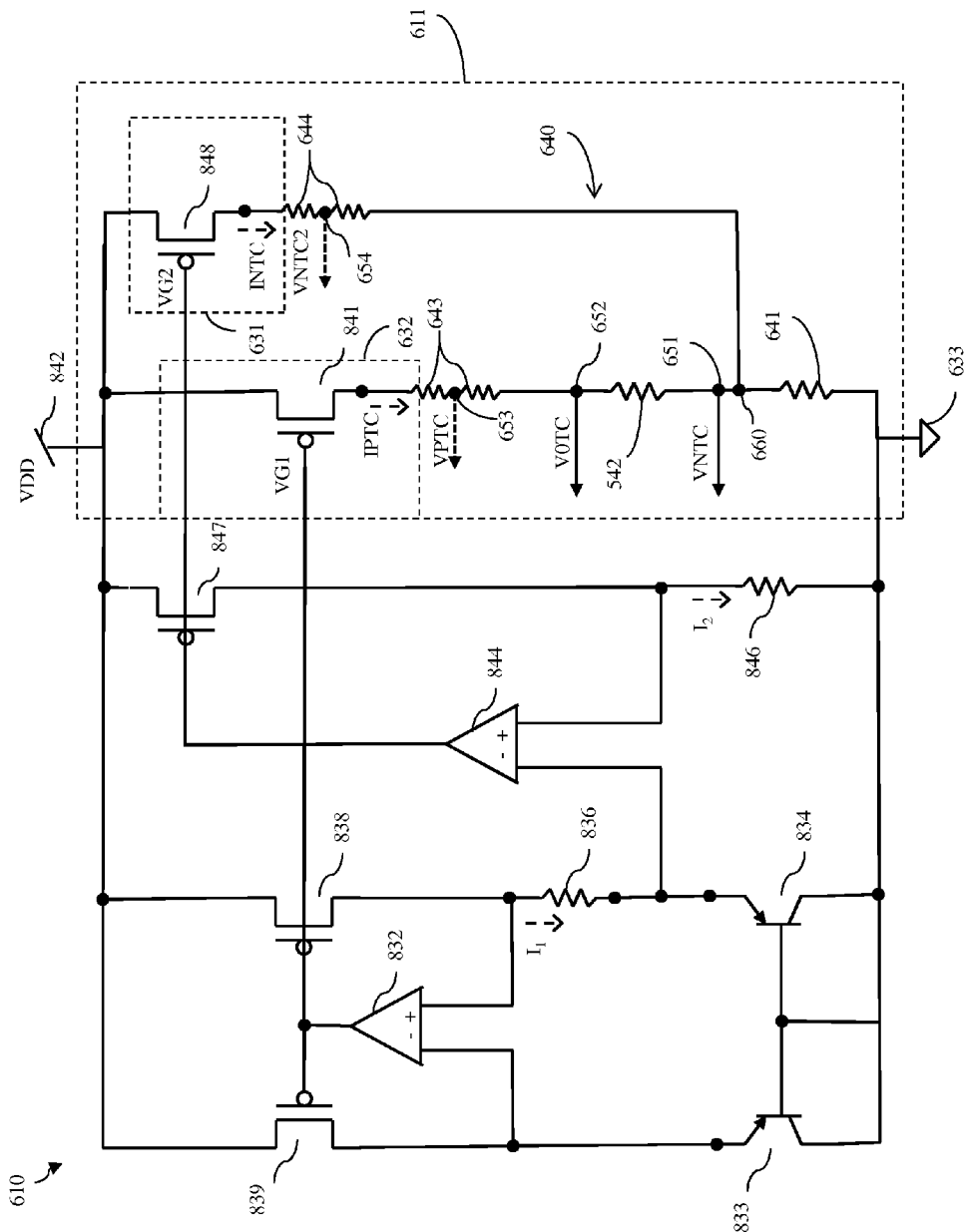
FIG. 8 is a schematic diagram illustrating in greater detail a voltage reference circuit incorporating an output stage having different taps at different locations for supplying reference voltages with different temperature coefficients.

As mentioned above, the voltage reference circuit 610 can comprise a bandgap voltage reference circuit. While bandgap voltage reference circuits, which have a single output stage that output a single reference voltage having a substantially neutral (i.e., flat or 0-value) temperature coefficient are well known in the art (e.g., see U.S. Pat. No. 5,666,046 of Mietus, issued on Sep. 9, 1997 and incorporated herein by reference), a bandgap reference circuit having an output stage 611 that outputs two or more reference voltages (e.g., see V0TC and VNTC) having different temperature coefficients is unknown. FIG. 8 is a more detailed schematic diagram illustrating an exemplary bandgap voltage reference circuit 610 incorporating the output stage 611 described above.

As illustrated, this exemplary bandgap voltage reference circuit 610 can be similar to that disclosed in Mietus, which was incorporated by reference above, but can have differently configured output stage 611. For example, the exemplary bandgap voltage reference circuit 610 can comprise an operational amplifier 832 having an inverting input (−), a non-inverting input (+) and an output. An emitter of a PNP bipolar transistor 833 can be connected to the inverting input of operational amplifier 832. A base of PNP bipolar transistor 833 can be connected to a base of a PNP bipolar transistor 834 and to the collectors of PNP bipolar transistors 833 and 834. That is, PNP bipolar transistors 833 and 834 can be connected in a diode configuration, wherein the anodes are common and formed by the common connection of the respective bases and collectors. The bases and collectors of PNP bipolar transistors 833 and 834 can be connected to ground 633. An emitter of PNP bipolar transistor 834 can be coupled to the non-inverting input terminal of operational amplifier 832 via a resistor 836 and can serve as a cathode of a diode, which is connected transistor 834. The emitter of diode connected PNP bipolar transistor 833 can serve as its cathode. The node between the cathode of diode connected transistor 834 and resistor 836 can serve as a reference node. The emitter area of PNP bipolar transistor 834 can be scaled relative to the emitter area of PNP bipolar transistor 833. In addition, the non-inverting input of operational amplifier 832 can be connected to a drain of a p-channel FET 838. The inverting input of operational amplifier 832 can be connected to a drain of a p-channel FET 839. The output (VG1) of operational amplifier 832 can be connected to the gates of p-channel FETs 838 and 839 as well as to the gate of a p-channel FET 841, which forms the second current source 632 of the output stage 611. The sources of p-channel FETs 838, 839, and 841 are connected to a power supply electrode 842 (e.g., $V_{DD}$). A drain of p-channel FET 841 is coupled to the third resistor 643. The dimensions (e.g., the width-to-length ratio) of p-channel PET 841 of the FET 841 can be scaled relative to the dimensions of p-channel FETs 838 and 839. It should be noted that operational amplifier 832, PNP bipolar transistors 833 and 834, resistor 836, and p-channel FETs 838, 839, and 841 cooperate to form an amplifier circuit for generating the second current (IPTC) having the positive temperature coefficient at the output of second current source 631 in the output stage 611 Furthermore, the operational amplifier 832, PNP bipolar transistors 833 and 834, and resistor 836 cooperate to form a delta voltage generating circuit.

The exemplar bandgap voltage reference circuit 610 can further comprise an operational amplifier 844 having an inverting input, (−), a non-inverting input (+), and an output. The inverting input of operational amplifier 844 can be connected to the emitter of PNP bipolar transistor 834. The non-inverting input of operational amplifier 844 can be coupled to ground 633 via a resistor 846 and directly connected to a drain of a p-channel FET 847. The output (VG2) of operational amplifier 844 can be connected to a gate of p-channel FET 847 as well as to a gate of a p-channel FET 848, which forms the first current source 631 in the output stage 611. The sources of p-channel FETs 847 and 848 are connected to the power supply conductor 842. The drain of p-channel PET 848 can be connected to the drain of p-channel FET 841 to form a common electrode. The dimensions (i.e., the width-to-length ration) of p-channel PET 848 can be scaled relative to the dimensions of the p-channel PET 847. Since the drains of p-channel FETs 841 and 848 are connected to resistor 843, resistor 843 serves as a summing circuit. It should be noted that the dimensions for p-channel FET 847 are preferably the same as those for p-channel FETs 838 and 839. It should be further noted that operational amplifier 844, PNP bipolar transistor 834, p-channel FETs 847 and 848, and resistor 846 cooperate to form an amplifier circuit for generating the first current (INTC) having a negative temperature coefficient at the output of the first current source 631 in the output stage 611. Thus, PNP bipolar transistor 834 is common to the first and second amplifier circuit.

It should be understood that although the transistors 833 and 834 are shown as PNP bipolar transistors, alternatively other types of transistors (e.g., NPN bipolar transistors, or other PN semiconductor structures, or the like) could be used. Similarly, although transistors 838, 839, 841, 847, and 848 are shown as comprising p-channel field effect transistors, alternatively, other types of transistors (e.g., n-channel field effect transistors, PNP bipolar transistors, NPN bipolar transistors, or the like) could be used. However, as those skilled in the art are aware, additional circuitry is required when NPN bipolar transistors or n-channel field effect transistors are used for current mirror transistors 838, 839, 841, 847, and 848. It should be further understood that an appropriate start-up circuit is typically used to start the circuit at the proper operating point.

In operation, the operational amplifier 832 and p-channel FETs 838, 839, and 841 form a current mirror, wherein the drain of p-channel PET 838 serves as a reference current electrode and the drain of p-channel PET 841 serves as an output current electrode. The output of operational amplifier 832 serves as a control node for the current mirror. Thus, the current flowing in the drain of p-channel FET 838 serves as a reference current $I_1$ and the current flowing in the drain of p-channel PET 841 is the output second current (PIC) from the second current source 631 of the output stage 611. Since the dimensions of p-channel FETs 838 and 841 are scaled relative to each other, the output second current (IPTC) is scaled relative to the reference current $I_1$ by the same scaling factor. Thus, the second current (IPTC) is distinguished from the reference current $I_1$ by a prime ('). The currents $I_1$ and the second current (IPTC) are equal when the scaling factor equals one. The value of reference current $I_1$ is determined using Kirchoff's voltage law and the virtual ground appearing across the inputs of operational amplifier 832. Thus, the current flowing in the series combination of the resistor 836 and the emitter of PNP bipolar transistor 834 equals the reference current $I_1$.

It should be understood that since the current flowing into an input of an operational amplifier is negligible, the current flowing in the drain of p-channel FET 838 is equal to current $I_1$. Current $I_1$ generates a source-gate voltage in p-channel FET 838 which also appears across the source and gate of p-channel FET 839. Thus, the current $I_1$ also flows in the drain of p-channel FET 839 and in the emitter of PNP bipolar transistor 833. It should be noted that the drain of p-channel FET 839 serves as a feedback electrode. However, the current densities flowing in the emitters of PNP bipolar transistors 833 and 834 are different because their areas are different. As those skilled in the art are aware, for two bipolar transistors fabricated in near proximity to each other that operate at the same emitter current, the currents $I_1$ and $I_1'$ will be linear functions of absolute temperature with positive temperature coefficients.

Operational amplifier 844 and p-channel FETs 847 and 848 form a current mirror, wherein the drain of p-channel PET 847 serves as a reference current electrode and the drain of p-channel FET 848 serves as an output current electrode (i.e., as the first current source 631 of the output stage 611). The output (VG2) of operational amplifier 844 serves as a control node for the current mirror. Thus, the current flowing in the drain of p-channel PET 847 serves as a reference current $I_2$ and the current flowing in the drain of p-channel FET 848 serves as the first current (INTC) output from the first current source 631 of the output stage. Since the dimensions of p-channel FETs 847 and 848 are scaled relative to each other by a scaling factor, as the first current (INTC) is scaled relative to the reference current $I_2$ by the same scaling factor. Thus, the first current (INTC) is distinguished from the reference current $I_2$ by a prime ('). The currents $I_2$ and INTC are equal when the scaling factor equals one. The value of reference current $I_2$ is determined using Kirchoff's voltage law and the virtual ground appearing across the inputs of operational amplifier 844. Thus, the current flowing in resistor 846 equals the reference current $I_2$. Again, the current flowing into an input of an operational amplifier is negligible, thus the current $I_2$, is equal to the current flowing in the drain of p-channel FET 847. Since the currents $I_2$, and INTC are dependent on the base-to-emitter voltage, they have negative temperature coefficients.

As discussed in detail above, the first current INTC and the second current WIC flow and mix within the resistive network 640 to generate the different output reference voltages (e.g., see VNTC, V0TC, VPTC, VNTC2, etc.) at the different taps 651-654.

Figure 9:
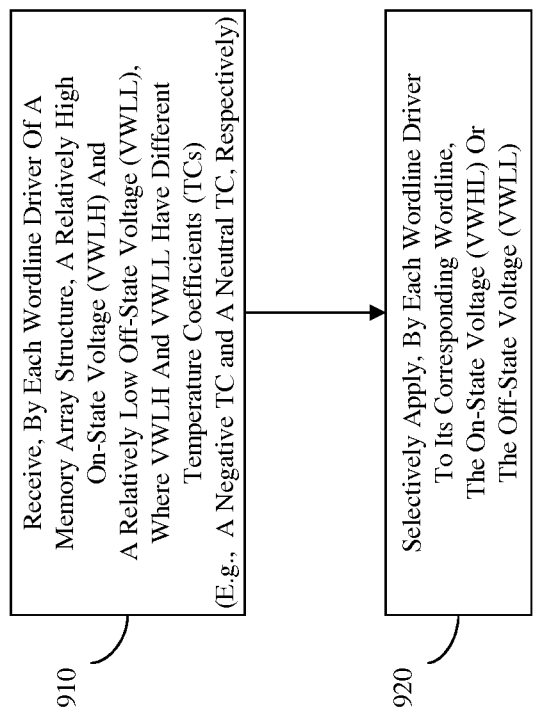
FIG. 9 is a flow diagram illustrating embodiments of a method of operating a memory array structure.

Referring to FIG. 9 in combination with the memory array structure described above and illustrated in FIG. 1, also disclosed herein are embodiments of an associated method of operating such a memory array structure 100. The method embodiments can comprise receiving, by each of the wordline drivers 105, a relatively high on-state voltage (VWLH) and a relatively low off-state voltage (VWLL), where the on-state voltage (VWLH) and off-state voltage (VWLL) have different temperature coefficients (910). The method can further comprise selectively applying, by each wordline driver 105 to its corresponding wordline 102, either the on-state voltage (VWLH) or the off-state voltage (VWLL) (920). As discussed in greater detail with regard to the structure embodiments above and shown in the graph of FIG. 2, the relatively low off-state voltage (VWLL) can have a substantially neutral temperature coefficient (also referred to herein as a flat temperature coefficient or a 0-value temperature coefficient) so that it remains essentially constant with changes in temperature. The relatively high on-state voltage (VWLH) can have a slightly negative temperature coefficient so that it increases slightly with decreasing operating temperature and vice versa. This slightly negative temperature coefficient of the on-state voltage (VWLH) can be pre-established in order to take advantage of increases in gate dielectric reliability at lower operating temperatures by increasing operating voltage and to compensate for decreases in gate dielectric reliability at higher temperatures by decreasing operating voltage. For example, in one embodiment, the relatively low off-state voltage (VWLL) can be approximately −0.354V and can remain essentially constant at all temperatures between −25° C. and 125° C. However, the relatively high on-state voltage (VWLH) can decrease from approximately 1.670V to approximately 1.600V when the operating temperature increases from approximately −25° C. to approximately 125° C. and vice versa.

It should be understood that the terminology used herein is for the purpose of describing particular embodiments only and is not intended to be limiting of this disclosure. As used herein, the singular forms "a", "an" and "the" are intended to include the plural forms as well, unless the context clearly indicates otherwise. It should be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Furthermore, the corresponding structures, materials, acts, and equivalents of all means or step plus function elements in the claims below are intended to include any structure, material, or act for performing the function in combination with other claimed elements as specifically claimed. The descriptions of the various embodiments disclosed herein have been presented for purposes of illustration, but are not intended to be exhaustive or limited as disclosed. Many modifications and variations will be apparent to those of ordinary skill in the art without departing from the scope and spirit of the disclosed embodiments. The terminology used herein was chosen to best explain the principles of the embodiments disclosed herein, the practical application or technical improvement of the embodiments disclosed herein over technologies found in the marketplace, and/or to enable others of ordinary skill in the art to understand the embodiments disclosed herein.

Therefore, disclosed above are embodiments of a memory array structure (e.g., embedded dynamic random access memory (eDRAM) array structures), where a wordline driver is coupled to a wordline and selectively applies either a relatively high on-state voltage (VWLH) to the wordline or a relatively low off-state voltage (VWLL) to the wordline. However, in this case, the on-state voltage (VWLH) and the off-state voltage (VWLL) have different temperature coefficients. Specifically, the on-state voltage (VWLH) has a slightly negative temperature coefficient so that it is regulated as high as the gate dielectric reliability limits allow, whereas the off-state voltage (VWLL) has a substantially neutral temperature coefficient. To accomplish this, the wordline driver can be electrically coupled to one or more voltage regulation circuits. For example, in one embodiment, the wordline driver can be electrically coupled to a single voltage regulation circuit, which incorporates a single voltage reference circuit having a single output stage that outputs multiple reference voltages with different temperature coefficients. These reference voltages are then used to generate the on-state voltage (VWLH) and off-state voltage (VWLL) for the wordline.

Also disclosed herein are embodiments of such a voltage reference circuit, which can be incorporated into the voltage regulation circuit of a memory array structure, as described, or, alternatively, incorporated into any other integrated circuit structure requiring voltages with the different temperature coefficients. Finally, also disclosed herein are embodiments of a method of operating a memory array structure.

What is claimed is:

1. A memory array structure comprising:
   a plurality of memory cells;
   a wordline operatively connected to said memory cells;
   a wordline driver coupled to a first node at a relatively high on-state voltage, to a second node at a relatively low off-state voltage and to said wordline, said wordline driver selectively applying one of said relatively high on-state voltage and said relatively low off-state voltage to said wordline, said relatively high on-state voltage having a negative temperature coefficient and said relatively low off-state voltage having a substantially neutral temperature coefficient; and,
   a voltage regulation circuit providing said on-state voltage to said first node and, thereby to said wordline driver and further providing said off-state voltage to said second node and, thereby to said wordline driver.

2. The memory array structure of claim 1, said negative temperature coefficient ensuring that an increase in an operating temperature of said memory array structure causes a decrease in said on-state voltage in order to minimize any reliability degradation caused by a corresponding decrease in gate dielectric reliability with said increase in said operating temperature.

3. The memory array structure of claim 1, said negative temperature coefficient ensuring that said on-state voltage ranges from approximately 1.670V at −25° C. to approximately 1.600V at 125° C.

4. The memory array structure of claim 1, said voltage regulation circuit comprising:
   a voltage reference circuit having an output stage outputting a first reference voltage with said negative temperature coefficient and a second reference voltage with said substantially neutral temperature coefficient;
   a first voltage regulator receiving said first reference voltage from said output stage;
   a positive voltage pump being electrically connected in a first feedback loop with said first voltage regulator and outputting said on-state voltage with said negative temperature coefficient to said first node and, thereby to said wordline driver;
   a second voltage regulator receiving said second reference voltage from said output stage; and
   a negative voltage pump being electrically connected in a second feedback loop with said second voltage regulator and outputting said off-state voltage with said substantially neutral temperature coefficient to said second node and, thereby to said wordline driver.

5. The memory array structure of claim 4, said voltage reference circuit comprising a bandgap voltage reference circuit.

6. A memory array structure comprising:
   a voltage regulation circuit comprising:
      a voltage reference circuit outputting a first reference voltage with a negative temperature coefficient and a second reference voltage with a substantially neutral temperature coefficient;
      a first voltage regulator receiving said first reference voltage;
      a positive voltage pump being electrically connected in a first feedback loop with said first voltage regulator and outputting an on-state voltage with said negative temperature coefficient;
      a second voltage regulator receiving said second reference voltage; and
      a negative voltage pump being electrically connected in a second feedback loop with said second voltage regulator and outputting an off-state voltage with said substantially neutral temperature coefficient;
   a plurality of memory cells;
   a wordline operatively connected to said memory cells; and
   a wordline driver coupled between said voltage regulation circuit and said wordline, said wordline driver selectively applying one of said on-state voltage and said off-state voltage to said wordline.

7. The memory array structure of claim 6, said negative temperature coefficient ensuring that an increase in an operating temperature of said memory array structure causes a decrease in said on-state voltage in order to minimize any reliability degradation caused by a corresponding decrease in gate dielectric reliability with said increase in said operating temperature.

8. The memory array structure of claim 6, said negative temperature coefficient ensuring that said on-state voltage ranges from approximately 1.670V at −25° C. to approximately 1.600V at 125° C.

9. The memory array structure of claim 6, said voltage reference circuit comprising an output stage comprising:
   a pair of current sources comprising:
      a first current source outputting a first current having a negative temperature coefficient;
      a second current source outputting a second current having a positive temperature coefficient;
   a resistive network electrically connecting said first current source, said second current source and ground at a single node, said resistive network comprising:
      a first resistor, a second resistor and a third resistor connected in series between ground and said second current source; and
      a fourth resistor connected in series between said node and said first current source, said node being positioned between said first resistor and said second resistor; and
   a plurality of taps electrically connected to said resistive network at different locations, said first current and said second current mixing in said resistive network such that voltages at said taps have different temperature coefficients.

10. The memory array structure of claim 9, said plurality of taps comprising:
   a first tap electrically connected to said resistive network between said first resistor and said second resistor such that said first reference voltage on said first tap has said negative temperature coefficient; and
   a second tap electrically connected to said resistive network between said second resistor and said second current source such that said second reference voltage on said second tap has said substantially neutral temperature coefficient.

11. The memory array structure of claim 6, said voltage reference circuit comprising a bandgap reference circuit.

12. A voltage reference circuit comprising:
   a pair of current sources comprising:
      a first current source outputting a first current having a negative temperature coefficient;

a second current source outputting a second current having a positive temperature coefficient;

a resistive network electrically connecting said first current source, said second current source and ground at a single node; and a plurality of taps electrically connected to said resistive network at different locations, said first current and said second current mixing in said resistive network such that reference voltages at said taps have different temperature coefficients, said resistive network comprising:

a first resistor, a second resistor and a third resistor connected in series between ground and said second current source; and a fourth resistor connected in series between said node and said first current source, said node being positioned between said first resistor and said second resistor.

13. The voltage reference circuit of claim 12, further comprising a bandgap voltage reference circuit having a single output stage comprising said pair of current sources, said resistive network and said plurality of taps.

14. The voltage reference circuit of claim 12, said plurality of taps comprising a first tap electrically connected to said resistive network between said first resistor and said second resistor such that a first reference voltage on said first tap has a relatively small negative temperature coefficient.

15. The voltage reference circuit of claim 12, said plurality of taps comprising a second tap electrically connected to said resistive network between said second resistor and said third resistor such that a second reference voltage on said second tap has a neutral temperature coefficient.

16. The voltage reference circuit of claim 12, said plurality of taps comprising a third tap electrically connected to said resistive network adjacent to said third resistor such that a third reference voltage on said third tap has a positive temperature coefficient.

17. The voltage reference circuit of claim 12, said plurality of taps comprising a fourth tap on said resistive network adjacent to said fourth resistor such that a fourth voltage on said fourth tap has a relatively large negative temperature coefficient.

18. A method of operating a memory array structure comprising a wordline operatively connected to a plurality of memory cells, said method comprising:

supplying, by a voltage regulation circuit, a relatively high on-state voltage to a first node and a relatively low off-state voltage to a second node, said first node and said second node each being electrically coupled to a wordline driver and said wordline driver further being electrically coupled to said wordline; and, selectively applying, by said wordline driver to said wordline, one of said relatively high on-state voltage and said relatively low off-state voltage, said relatively high on-state voltage having a negative temperature coefficient and said relatively low off-state voltage having a substantially neutral temperature coefficient.

19. The method of claim 18, said negative temperature coefficient ensuring that an increase in an operating temperature of said memory array structure causes a decrease in said on-state voltage in order to minimize any reliability degradation caused by a corresponding decrease in gate dielectric reliability with said increase in said operating temperature.

20. The method of claim 18, said negative temperature coefficient ensuring that said on-state voltage ranges from approximately 1.670V at −25° C. to approximately 1.600V at 125° C.

* * * * *